United States Patent [19]

Harting et al.

[11] Patent Number: 4,762,498

[45] Date of Patent: Aug. 9, 1988

[54] PIN-SHAPED CONTACT ELEMENT TO BE CONNECTED IN CONDUCTOR PLATE BORES

[75] Inventors: Dietmar Harting, Espelkamp; Hans Nagel, Porta Westfalica; Wolfgang Brauer, Spenge, all of Fed. Rep. of Germany

[73] Assignee: Harting Elektronik GmbH, Espelkamp, Fed. Rep. of Germany

[21] Appl. No.: 474,846

[22] Filed: Mar. 14, 1983

[30] Foreign Application Priority Data

Mar. 20, 1982 [DE] Fed. Rep. of Germany ....... 3210348

[51] Int. Cl.[4] .......................... H01R 9/09; H05K 1/04

[52] U.S. Cl. ...................................... 439/82; 439/751

[58] Field of Search .......... 339/220 R, 221 R, 221 M, 339/17 C

[56] References Cited

U.S. PATENT DOCUMENTS 4,223,970 9/1980 Walter ........................ 339/220 R X
4,274,699 6/1981 Keim ........................... 339/176 MP
4,415,220 11/1983 Kant ............................... 339/221 R

FOREIGN PATENT DOCUMENTS 8105896 8/1982 Fed. Rep. of Germany .

*Primary Examiner*—Gil Weidenfeld
*Assistant Examiner*—Steven C. Bishop
*Attorney, Agent, or Firm*—Jordan and Hamburg

[57] ABSTRACT

A pin-shaped contact element to be connected or fastened in a metallized conductor plate bore has a fastening portion with two sidepieces which are movable towards each other and which are connected to each other by a resilient, undulating connecting bridge, the edges of the side pieces which come into contact with the bore walls and the juncture between the bridge and the side pieces being rounded.

7 Claims, 2 Drawing Sheets

Fig.1
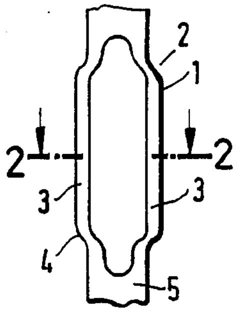
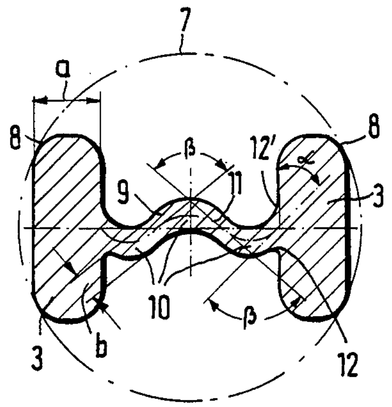
Fig.2
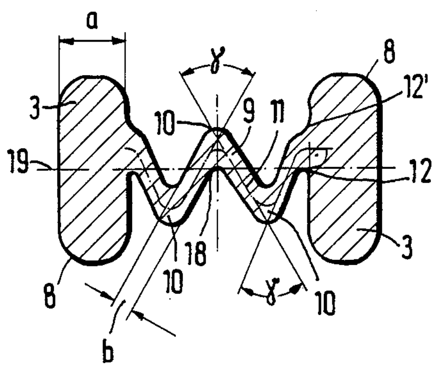
Fig.3

PIN-SHAPED CONTACT ELEMENT TO BE CONNECTED IN CONDUCTOR PLATE BORES

BACKGROUND OF THE INVENTION

This invention relates to a plug-shaped contact element to be connected or fastened in conductor plate bores, preferably in metallized bores, having a connecting portion with two parallel sidepieces which are movable towards one another and with the sidepieces being connected to each other by a resilient, undulating connecting bridge.

It is generally necessary for contact elements of the type which are to be pressed into metallized conductor plate bores and thus establish electrical contact with the bore walls to be such that these contact elements, on the one hand, can be inserted into bores with various diameters, in which case the electrical contact established with the bore wall has to be sufficient and, on the other hand, provides for the exchange of defective contact elements for repair purposes. In this connection the arrangement has to be such that the metallized conductor plate bore is not inadmissibly deformed or damaged when pushing in the contact element.

In a known pin-shaped contact element of the type initially mentioned (for example as in DE-GM No. 81 05 896), a flexible connecting bridge connecting the two sidepieces of the fastening portion is partly plastically and partly elastically flexible. In the known push-in pin, the cross section of the fastening portion can be in the form of an M, N or X.

In the M-shaped version, the legs of the bridge preferably have an angle of approximately 45° relative to the sidepieces and subtend an angle of approximately 90° to each other. The connecting bridge between the two sidepieces can also be W-shaped. In the known push-in pin, the fastening of the connecting bridge to the sidepieces (seen in cross section) is effected from the ends on the interior surface of the sidepieces.

The known push-in pin is generally satisfactorily suited for a one-time push-in into a metallized conductor plate bore. However, because of the sharp edges of the sidepieces touching the metal bore, there is often serious damage to the metal due to the edges piercing the metal. This is true especially in those cases where extremely precise and synchronized bore and pin measurements are not provided. This being the case in that the economic and general production criteria of such contact pins and conductor plate bores does not generally provide for high tolerance levels.

Furthermore, there is uneven edge stress on the contact edges in the known push-in formation in the bore because of the fastening of the connecting bridge onto the ends of the sidepieces which in turn leads to distortion and tipping tendencies of the pin to be pushed in. By the so-caused irreversible damages and deformation of the metallized bore, an exchange, i.e. the removal of the pin from the bore and the insertion of a new pin into the same bore, is often not possible in a satisfactory manner. Also there are frequent contact problems, especially as regards the necessary gas tight, vibration-safe, long term contact.

The present invention has as an object to provide a pin-shaped contact element to be pushed into metallized conductor plate bores, the tolerance levels of which as regards the bore and push-in area measurements are markedly increased, and which provides an even contact pressure on all contact edges in the bore and which offers the possibility of inserting and removing contact elements without damage and substantial irreversible deformation of the walls of the bore, for example, for the problem-free exchange of contact elements for repair purposes. In this connection, a contact element inserted into the same bore using the common tolerances of todays ready-made manufacture technology would provide a friction safe, gas tight long term contact.

This object can be achieved in a technically advanced manner by providing that the connecting bridge is attached approximately in the middle of the interior surface of the sidepieces, that the transitions from the connecting bridge to the respective sidepiece are rounded, and that the edges of the sidepieces having contact with the bore walls of the conductor plate are also rounded.

The invention provides a pin-shaped contact element with a highly elastic push-in area which can be inserted into a conductor plate bore having very different diameters and furthermore, provides assurance that the metal of the bore is not unduly damaged or deformed, so that an exchange of possibly damaged contact elements is possible without any difficulty. Also a vibration-free, gas tight contact is established between the contact element and the metallized bore via four contact zones.

Furthermore, it is not only possible to remove the contact elements from the bore because of the highly elastic push-in area and to insert a new contact element into the same bore, but it is also possible to insert an already previously used contact element into the bore.

An additional advantage of the invention lies in the fact that the strength necessary to push in such push-in elements can be very minimal, making it possible to push in a number of contact elements together with a corresponding isolating body into a conductor plate.

Other features which are considered characteristic of the invention are set forth in the appended claims.

Although the invention is illustrated and described in relationship to specific embodiments, it is nevertheless not intended to be limited to the details shown, since various modifications and structural changes may be made therein without departing from the spirit of the invention and within the scope and range of equivalents of the claims.

The construction and operation of the invention, however, together with additional objects and advantages thereof will be best understood from the following description of specific embodiments when read in connection with the accompanying drawings.

BRIEF DESCRIPTION OF THE DRAWINGS

FIG. 1 is a side view of a contact pin according to one embodiment of this invention.

FIG. 2 is a view taken along line 2—2 in FIG. 1, but enlarged relative to FIG. 1.

FIG. 3 is a view similar to FIG. 2 showing another embodiment of a contact pin.

DESCRIPTION OF THE PREFERRED EMBODIMENTS

Figure 4:
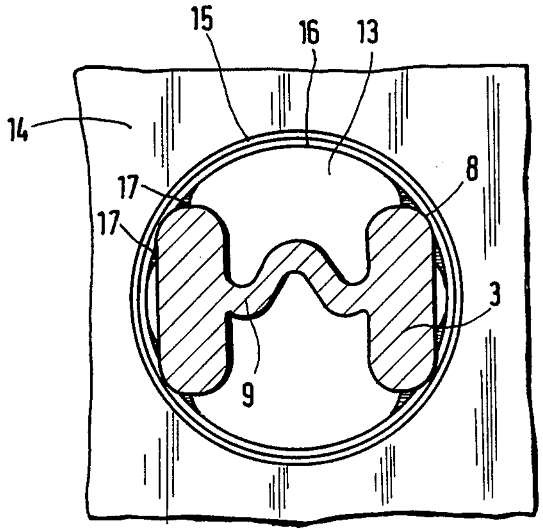
FIG. 4 is a cross sectional view of a contact element and conductor plate bore with the latter having a maximum diameter.

FIG. 1 shows the fastening portion 1 of a pin-shaped contact element 2. The fastening portion has a pin, bushing or fork contact in its upper portion, which is not shown in detail, as well as mounting and fastening devices for an isolating body. Towards the bottom, the contact element ends in a beveled introduction point or continues in the form of a rectangular connection post for wire wrapping purposes. This area is not shown in detail in order to limit the drawings to the essential characteristic of the invention, i.e. the fastening portion 1.

The fastening portion can be favorably produced out of a round base material or out of a rectangular base material. The forming of the sidepieces 3 takes place during a stamping process. In order to facilitate the introduction of the fastening portion into a conductor plate bore, the fastening portion changes into a lower contact area 5 leading to bevel area 4. When introducing or inserting the fastening portion into a conductor plate bore with a smaller diameter than the diameter of the perimeter 7 of the fastening portion, the outer edges 8 of the sidepieces 3 come into close contact with the bore walls and the elasticity of the connecting bridge 9 together with a certain elasticity of the junctions of the sidepieces in the upper or lower contact element area, results in a constant contact pressure of the edges on the bore walls. Such contact elements can be used in bores with very different diameters, in each case assuring a secure mounting and electrical contact to the metallized bore walls.

For the sake of completeness, it should be mentioned that the bores have different diameters due, on the one hand, to production tolerances and, on the other hand, due to different constructions of the metallized bore. These diameter tolerances of the bores are generally in the area of $\pm 5\%$ to $\pm 8\%$ and the bores may be produced without the need for complicated and expensive production methods.

FIGS. 1, 2, and 3 show fastening portions 1 of contact elements which can favorably be made out of round as well as out of rectangular base material. In order to more clearly show the details, an enlarged scale is shown in FIGS. 2 and 3.

The construction of the fastening portion, according to FIG. 2, will be explained in detail. The contact pin in this embodiment is provided with diametrically opposed sections in the fastening portion 1 and forming parallel sidepieces 3 as well as an undulating connecting bridge 9 between the two sidepieces. The connecting bridge has three bends 10 including a neutral or central section 11 and end sections extending into the corresponding sidepiece 3 at an angle $\alpha$ of 45°. The bends are formed in such a way that tangents applied to the neutral or central section 11 subtend an angle $\beta$ of 90°.

Furthermore, the connecting bridge is joined to the middle of the respective sidepiece which favorably influences the parallism of the sidepieces to each other when pushing the contact pin into a bore, achieving a largely even edge pressure of all contact edges 8 in the bore. The connection of the material of the bridge to the respective sidepiece are provided with rounded sections 12, 12'. The latter connection or transition is technically easier to produce than a sharp edged transition and such a smooth connection or transition is favorable for the angle stability when inserting the contact element in the conductor plate. By an appropriate choice of pin material and correspondingly thin construction of the connecting bridge the thickness (b) of the bridge is preferably ⅓ the thickness (a) of the sidepiece. In this manner, the bridge has elastic characteristics itself when being pushed together from the sides. Furthermore, the outer edges 8 of the sidepiece 3, which have contact with the bore wall when inserted, are rounded in order to avoid damaging the bore wall.

FIG. 3 shows a modified fastening portion of a contact element in cross section. The essential measurements and dimensions correspond with the fastening portion shown in FIG. 2 and described in detail above. However, in the embodiment of FIG. 3, the ends of the connecting bridge 9 extend perpendicular to the sidepiece 3. Further, the tangents of the bends 10 subtend an angle $\alpha$ of 45°, respectively. Thus, an even pushing-in of the fastening portion into a bore is assured and tilting of the fastening portion is prevented due to uneven movements of the ends of the sidepieces i.e. tilt inclination towards each other. This achieves an even edge pressure of all four contact edges 8 on the bore wall. This embodiment differs from the FIG. 2 embodiment where the connecting bridge is joined to the respective sidepiece in that the joining of the connecting bridge to the sidepiece 3 is offset or displaced relative to the middle of the respective sidepiece to such an extent that the interior reversion point 18 of the middle bend touches the transversely extending middle line 19. With this construction of the fastening portion, an even softer resilient characteristic of the connecting bridge is achieved. Also, in this embodiment, the tilting tendency of the ends of the sidepieces towards each other is completely eliminated when pushing into a bore.

Figure 5:
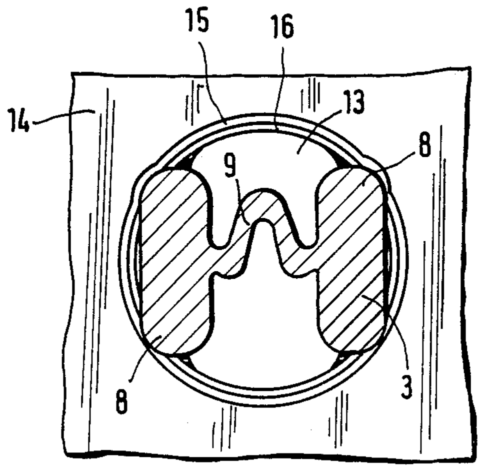
FIG. 5 is a cross sectional view of a contact element and conductor plate bore with the latter having a minimum diameter.

FIGS. 4 and 5 show the use of a contact element with a fastening portion, according to FIG. 2, in a conductor plate bore 13. FIG. 4 shows the use in a bore with a maximum diameter while FIG. 5 shows the use in a bore with a minimal diameter. For clarity's sake, an enlarged scale was chosen for these Figures. The walls of the bore 13 of the conductor plate 14 are provided with a copper-metallizing 15 and a tin layer 16.

As shown in FIG. 4, the edges 8 of the sidepieces 3 are in close contact with the metal of the bore walls when the fastening portion has been pushed in with the edges 8 penetrating the relatively soft tin layer 16. The affected or pushed-in tin material 17 positions itself close to the contact area of the sidepieces and assures a gas tight closing of the contact surface to the surrounding atmosphere.

The undulating, elastic connecting bridge 9 is, because of the largest bore diameter in this case, only minimally pushed together. However, due to the corresponding construction of the initial measurements according to FIG. 2, it is assured that the flexibility of the connecting bridge is sufficient enough to achieve a good long term contact of the sidepieces with the bore walls.

FIG. 5, for example, shows how the elastic connecting bridge 9 is changed when the fastening portion of the contact element is pushed into a conductor plate bore 13 which has a minimum diameter. It will be seen that the undulating connecting bridge is largely pushed together with the sidepieces 3 being pushed towards the bore walls with increased force.

Although the extensive flexibility of the connecting bridge can lead to a certain percentage or irreversible, plastic deformation, there is a large percentage of elasticity left. This assures the resilient pushing of the edges of the sidepieces against the bore walls. Due to the rounding of the edges 8 of the sidepieces, it is also assured that the edges do not damage the metallizing surface and only minimally deform it.

With the fastening portion constructed in a highly elastic manner as in the invention, it is possible to remove the contact element from the bore and to insert a new contact element without difficulty and, under certain circumstances, to insert the same or an already previously used contact element into the same bore.

What we claim is:

1. A pin-shaped contact element for separable engagement in a metallized bore of a conductor plate comprising an insertable fastening contact element having two parallel sidepieces, a resilient connecting bridge connected to said sidepieces, each of said two sidepieces having two rounded ends spaced from each other by an intermediate portion, at least portions of each of said rounded ends contacting the bore walls at four spaced locations when the insertable fastening contact element is inserted in said bore without damaging said conductor plate, the connection between said two sidepieces and said bridge being rounded, said connecting bridge having a thickness which is about one-third the thickness of said sidepieces, said connecting bridge being connected to said intermediate portions of said sidepieces to thereby provide substantially even contact pressure at said four spaced locations where said portions of said rounded ends contact said bore walls, said connecting bridge having an undulating configuration providing for elasticity of the connecting bridge, whereby the insertable fastening contact element is elastically deformable when inserted into a bore which is smaller than the contact element and substantially returns to its original undeformed configuration when removed from said bore.

2. A pin-shaped contact element according to claim 1 wherein each of said sidepieces has an inner wall, an outer wall and two end walls, said outer wall being joined to said end walls by rounded walls constituting the portions of the rounded ends which contact said bore walls.

3. A pin-shaped contact element according to claim 1 wherein said bridge has a central portion and two end portions, the axis of said two end portions being disposed at about a 45 degree angle relative to said sidepieces, said central portion having the configuration of a reverse bend the central axes of which subtend an angle of approximately 90 degrees.

4. A pin-shaped contact element according to claim 1 wherein said bridge has a central portion and two end portions, each of said end portions having a first section and a second section, said first sections being joined to the respective sidepiece the axes of each of said first sections extending from the respective sidepiece at an angle of approximately 90 degrees, said second section extending from said first section, the axes of said second sections extending approximately $22\frac{1}{2}$ degrees relative to said sidepieces.

5. A pin-shaped contact element according to claim 4 wherein said second sections each have the configuration of a reverse bend the axes of which subtend an angle of approximately 45 degrees.

6. A pin-shaped contact element according to claim 4 wherein said central portion has the configuration of a reverse bend the axes of which subtend an angle of approximately 45 degrees.

7. A pin-shaped contact element according to claim 6 wherein said reverse bend of said central portion defines a reversing point at the interior midpoint of said reverse bend, said reversing point being disposed approximately on a transverse midline passing through the midpoint of said sidepieces.

* * * * *